US 9,778,293 B1

(12) United States Patent
Klein et al.

(10) Patent No.: US 9,778,293 B1
(45) Date of Patent: Oct. 3, 2017

(54) MONITORING VOLTAGE LEVELS FOR DATA STORAGE DEVICES

(71) Applicant: Western Digital Technologies, Inc., Irvine, CA (US)

(72) Inventors: Barry L. Klein, Trabuco Canyon, CA (US); Joseph M. Zueck, Carlsbad, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 265 days.

(21) Appl. No.: 14/497,275

(22) Filed: Sep. 25, 2014

(51) Int. Cl.
G01R 19/00 (2006.01)
G01R 19/165 (2006.01)
G01R 17/02 (2006.01)

(52) U.S. Cl.
CPC ......... *G01R 19/1659* (2013.01); *G01R 17/02* (2013.01)

(58) Field of Classification Search
USPC .............................................. 324/538, 76.11
See application file for complete search history.

(56) References Cited

U.S. PATENT DOCUMENTS

| | | | |
|---|---|---|---|
| 6,417,675 B1 * | 7/2002 | Johnson | H03H 7/40 324/601 |
| 7,701,705 B1 | 4/2010 | Szeremeta | |
| 8,064,194 B2 | 11/2011 | Szeremeta | |
| 8,113,873 B1 | 2/2012 | Sarraf | |
| 8,133,426 B1 | 3/2012 | Yurchenco et al. | |
| 8,358,395 B1 | 1/2013 | Szeremeta | |
| 8,417,979 B2 | 4/2013 | Maroney | |
| 8,462,460 B1 | 6/2013 | Szeremeta et al. | |
| 8,498,088 B1 | 7/2013 | Klein | |
| 8,547,658 B1 | 10/2013 | Szeremeta | |
| 2004/0062157 A1 * | 4/2004 | Kawabe | G11B 7/08511 369/44.27 |
| 2007/0035408 A1 * | 2/2007 | Roberts | G10H 1/0008 340/815.45 |
| 2009/0051320 A1 * | 2/2009 | Muntermann | H02J 7/0068 320/116 |
| 2011/0187383 A1 * | 8/2011 | Tsubota | G01R 31/04 324/538 |
| 2012/0026634 A1 | 2/2012 | Liu | |
| 2012/0212349 A1 * | 8/2012 | Chang | H01R 13/6691 340/654 |

* cited by examiner

*Primary Examiner* — Vincent Q Nguyen
(74) *Attorney, Agent, or Firm* — Chang & Hale LLP

(57) ABSTRACT

Systems and methods are disclosed for monitoring a voltage received by a data storage device. A connection cable or data storage device may include a power monitoring module monitor the voltage received by the data storage device. The power monitoring module may provide an indication of whether voltage received by the data storage device is within a range of voltages.

19 Claims, 5 Drawing Sheets

MONITORING VOLTAGE LEVELS FOR DATA STORAGE DEVICES

BACKGROUND

Distribution of data storage across one or more data storage devices can provide increased data security through data redundancy. Direct-attached storage (DAS) devices may provide one or more computing devices with direct access to data via a connection cable (e.g., via a direct or physical connection). Network-attached storage (NAS) devices may provide access to data over computer networks (e.g., via a wired and/or wireless network).

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
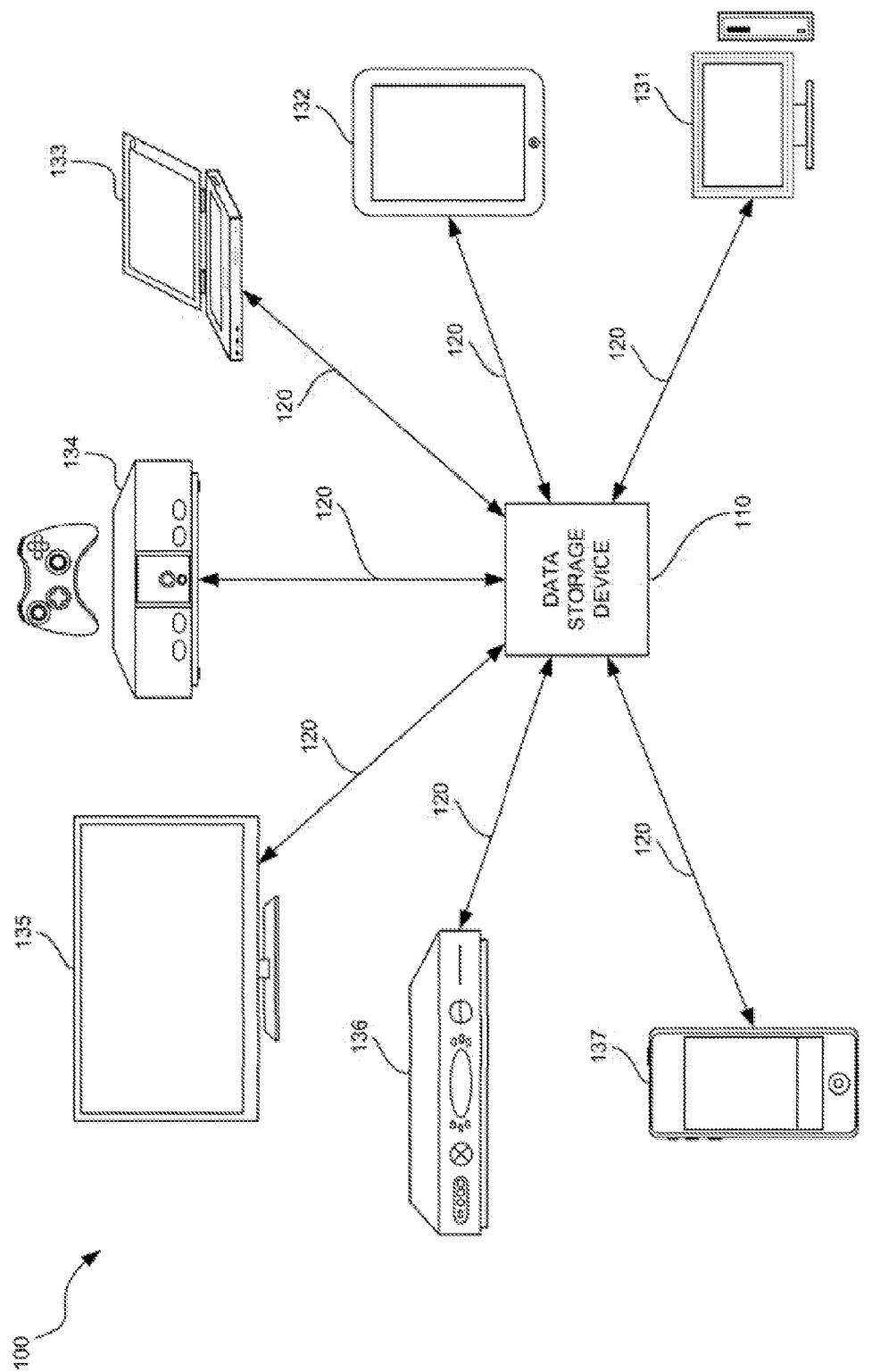
FIG. 1 is a diagram of a data storage system, according to an embodiment.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claimed invention. Disclosed herein are example implementations, configurations, and/or embodiments relating to monitoring input voltages for data storage device.

Overview

Data storage devices/systems may provide one or more computing devices with file-level data storage. One example of a data storage device/system may be a DAS device. The DAS device may be coupled to a computing device (e.g., a laptop computer, a desktop computer, etc.) via a connection cable (e.g., a universal serial bus (USB) cable, a serial advanced technology attachment (SATA) cable, etc.). A DAS device may provide a convenient mechanism for transferring data between computing devices, increasing the storage capacity (e.g., increase the storage space) of a computing device, and/or providing increased data security through data redundancy. Another example of a data storage device/system may be a NAS device. A NAS device may provide file-level data storage over a computer network, wherein access to the stored data is accessible to a group of clients. For example, a NAS device may include hardware, software, or a combination of such elements, configured such that the NAS device operates as a file server. NAS devices/systems can provide a convenient mechanism for sharing data among multiple computers and/or remotely accessing data stored on the NAS devices/systems. As compared to traditional file servers, benefits of NAS devices/systems may include the ability to access data from various locations (e.g., remote locations), faster data access, easier administration, and/or simpler configuration.

Certain embodiments disclosed herein provide the ability to monitor the voltage provided to and/or received by a data storage device. The voltage may be monitored to determine whether the voltage is within a range of voltages. The range of voltages may include a plurality of voltages. In one embodiment, an indication may be provided when the voltage is within the range of voltages. In another embodiment, an indication may be provided when the voltage is not within the range of voltages.

While certain embodiments are disclosed herein in the context of a particular communication interface (e.g., a bus interface such as SATA or USB), the principles disclosed herein may be applicable to any suitable or desirable communication interface. The examples, embodiments, and/or implementations described herein may be applicable to communication interfaces that may supply an input voltage to a data storage device. Examples of communication interfaces may include, but are not limited to, USB, SATA, IEEE 1394 (FireWire), Serial Attached SCSI (SAS), PCIe, Thunderbolt, etc.

Voltage Variations

FIG. 1 is a diagram of a data storage system 100, according to an embodiment. In the data storage system 100 a data storage device 110 may be communicatively coupled to one or more client devices (e.g., computing devices) in order to provide file-based data storage services to the one or more client devices (e.g., one or more computing devices). Types of client devices (e.g., computing devices) that may have access to the data storage device 110 may include, but are not limited to, phones 137 (e.g., smart phones, cellular phones, etc.), cable set-top boxes 136, smart TV's 135, video game consoles 134, laptop computers 133, tablet computers 132, desktop computers 131, wearable computers and/or other types of computing devices.

The data storage device 110 device may provide various client devices (e.g., phones 137, cable set-top boxes 136, smart TV's 135, video game consoles 134, laptop computers 133, tablet computers 132, desktop computers 131) with access to various types of user data stored on the data storage device 110. The data storage device 110 may also allow users to store various types of user data on the data storage device 110. The data storage device 110 may comprise magnetic media, hard disk media, and/or solid-state media. While certain description herein refers to solid state memory generally, it is understood that solid state memory may comprise one or more of various types of solid state non-volatile memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

In one embodiment, the data storage device 110 may be a NAS device. The NAS device may also be coupled to the client devices (e.g., computing devices) 131-137 via a network (not shown in FIG. 1). In one embodiment, network may include a public network (e.g., the Internet), a private network (e.g., a local area network (LAN)), or wide area network (WAN) such as the Internet, a wired network (e.g., Ethernet network), a wireless network (e.g., an 802.11 network or a Wi-Fi network), a cellular network (e.g., a Long Term Evolution (LTE) network), routers, hubs, switches, server computers, other types of computer networks, and/or a combination thereof.

With further reference to FIG. 1, the data storage device 110 (e.g., magnetic disk drive, hybrid hard drive, solid-state drive, etc.) may include a controller (not shown in FIG. 1) configured to receive data commands and to execute such commands in one or more non-volatile memory components of the data storage device 110. Such commands may include data read/write commands, and the like. The controller may be configured to receive data commands from a storage interface residing on a computing device. Data commands may specify a block address in the data storage device 110 and data may be accessed/transferred based on such commands.

The data storage device 110 may be configured to store data in one or more magnetic recording disks and/or the solid state memory devices/arrays. In an embodiment, the data storage device 110 may comprise a cable box, a backup disk drive, a media storage unit, a streaming media device, a digital camera, or any other electronic device which may store data that may need to be accessed directly or wirelessly.

In certain embodiments, the data storage device 110 may store data received from a client device such that the data storage device 110 acts as data storage for the client device. To facilitate this function, the data storage device 110 may implement a logical interface. The logical interface can present to the client device memory as a set of logical addresses (e.g., sequential/contiguous addresses) where data may be stored. Internally, the controller may map logical addresses to various physical memory addresses in the non-volatile memory of the data storage device 110. Mapping data indicating the mapping of logical addresses to physical memory addresses may be maintained in the data storage device 110.

The data storage device 110 may be coupled to the one or more client devices via a connection cable 120 (e.g., a USB cable, a SATA cable, etc.). In one embodiment, the data storage device 110 may receive a voltage from a client device or a power supply via the connection cable 120. The voltage may be used to power the data storage device 110. For example, the voltage received from the client device may be used to operate a hard disk in the data storage device 110. In another example, the voltage received from the client device may be used to operate a controller in the data storage device 110. The voltage (received from the client device and/or provided by the client device) may be referred to as an input voltage.

Although data storage drives/system can provide various benefits, as described above, in certain configurations, such systems may be associated with various issues and/or drawbacks. For example, the client device or power supply may not be able to provide a steady input voltage to the data storage device 110 (e.g., the input voltage provided by the client device to the data storage device 110 may vary or fluctuate). In another example, the client device or power supply may provide the data storage device 110 with an input voltage that is too high or too low for the data storage device 110 to use. An input voltage that is too high may damage the data storage device 110 (e.g., may overheat components of the data storage device 110). An input voltage that is too low may cause the data storage device 110 to not operate properly (e.g., data read and/or write operations may not complete because there is not enough power).

Certain embodiments disclosed herein provide the ability to monitor the voltage (e.g., the input voltage) provided to and/or received by a data storage device. The voltage may be monitored to determine whether the voltage is within a range of voltages. The range of voltages may include one or more voltages. In one embodiment, an indication may be provided when the voltage is within the range of voltages. In another embodiment, an indication may be provided when the voltage is not within the range of voltages. Providing an indication of whether the voltage is within the range of voltages (or is not within the range of voltages) may allow users to more easily diagnose problems with the operation of the data storage device. Providing an indication of whether the voltage is within the range of voltages (or is not within the range of voltages) may also help protect the data storage device from damage and/or from data loss.

Monitoring Voltages Received by Data Storage Devices

Figure 2:
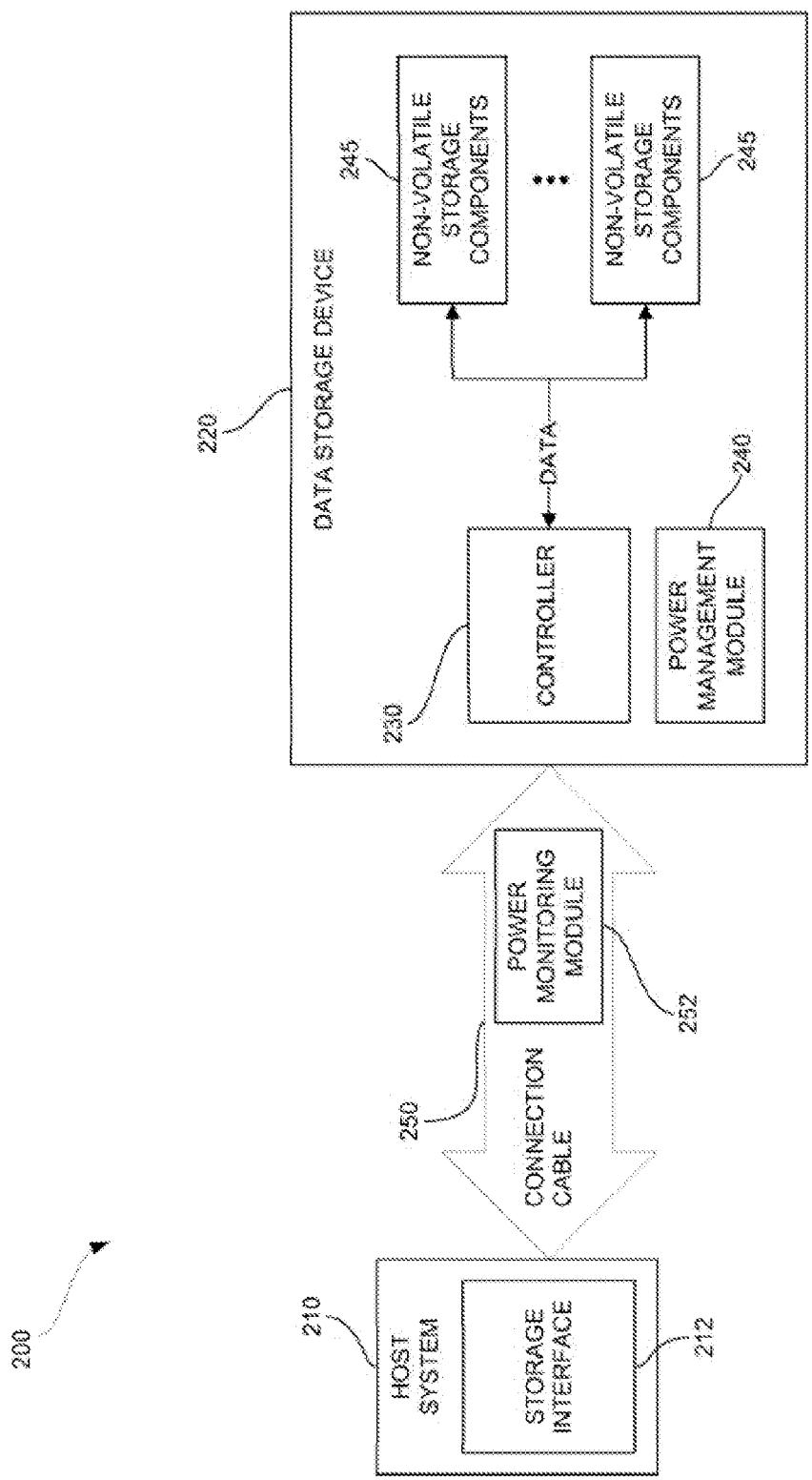
FIG. 2 is a diagram of a data storage system, according to an embodiment.

FIG. 2 is a diagram of a data storage system 200 according to an embodiment. The data storage system 200 includes a host system 210, a connection cable 250, and a data storage device 220. The data storage device 220 may include a controller 230, a power management module 240, and non-volatile storage components 245. In one embodiment, the non-volatile storage components 245 may include non-volatile magnetic media, and/or solid-state memory, such as NAND flash. The controller 230 may provide overall control for the data storage device 220. In certain embodiments, the data storage device 220 may be a hard disk drive. The non-volatile storage components 245 may include one or more disks and the data storage device 220 may further include one or more heads (not shown) actuated radially over the disk(s), and a spindle motor for rotating the disk(s). Alternatively to, or in addition to, magnetic rotating media, solid-state memory and/or other non-volatile memory such as MRAM and/or phase change memory may be used. In certain embodiments, the data storage device 220 may be, for example, a hybrid hard drive including both magnetic media and solid-state media.

The controller 230 may receive data and storage access commands from a storage interface 212 of a host system 210. Storage access commands communicated by the storage interface 212 may include write and read commands issued by the host system 210. The storage access commands may specify an LBA, or range of LBAs, in the data storage device 220, and the controller 230 may execute the received storage access commands in the non-volatile storage components 245. In a hybrid hard drive, data may be stored in a magnetic media storage component as well as non-volatile solid-state memory.

The data storage device 220 may store data received from the host system 210, such that the data storage device 220 acts as memory for the host system 210. To facilitate this memory function, the controller 230 may implement a logical interface. The logical interface may present to the host system 210 the memory of the data storage device 220 as a set of logical addresses (e.g., contiguous address) where data can be stored. The controller 230 may map logical addresses to various physical memory addresses in the non-volatile storage components 245 and/or other memory module(s).

The data storage device 220 may be configured to implement data redundancy, wherein user data stored in the non-volatile storage components 245 is maintained in one or more internal and/or external drives. For example, the controller 230 may include a data redundancy management module (not shown in FIG. 2) configured to implement redundancy functionality. The data redundancy management module may implement redundant array of independent disks (RAID) technology, wherein the non-volatile storage components 245 includes a plurality of internal drives, disks, or other data storage partitions combined into a logical unit for the purposes of data redundancy and performance improvement. In addition, or alternatively, the data redundancy management module may be configured to implement RAID using one or more internal memory modules in combination with one or more external memory devices, as discussed in greater detail below.

For RAID purposes, the non-volatile storage components 245 may include an array of one or more storage devices, such as hard disks or other memory modules that are configured to store user data. In certain embodiments, such internal memory modules/disks may be each directly coupled to the controller 230 to provide a high bandwidth interface for reading and writing user data. The non-volatile storage components 245 may include one or more additional memory modules configured to store parity information.

The controller 230 may be configured to divide and replicate user data among the physical RAID memory modules, providing storage virtualization; the array may be accessed by the host system 210 as a single drive. Data may be distributed across the RAID memory modules/drives according to any desirable or practical RAID level, depending on the level of redundancy and/or performance desired. For example, the data storage device 220 may be configured to implement RAID 0, RAID 1, RAID 5, RAID 10, or other RAID technology, depending on data reliability, availability, performance and/or capacity considerations or requirements.

The host system 210 may be coupled to the data storage device 220 via connection cable 250. The connection cable 250 may directly connect the host system 210 and the data storage device 220. The connection cable 250 may use one or more communication interfaces (such as a bus interface) and/or protocols that may allow the host system 210 to communicate with the data storage device 220. Examples of communication interfaces may include, but are not limited to, USB, SATA, IEEE 1394 (FireWire), Serial Attached SCSI (SAS), PCIe, Thunderbolt, etc. The connection cable 250 may include one or more data lines (e.g., one or more wires, pins, etc.) that allow the host system 210 to communicate data with the data storage device 220. For example, the connection cable 250 may include data lines (not shown in FIG. 2) that the host system 210 may use to read data from and/or write data to the data storage device 220. The host system 210 may communicate data to and from the data storage device using the storage interface 212 (e.g., via the storage interface 212).

As discussed above, the host system 210 may provide an input voltage to the data storage device 220 and the data storage device 220 may use the input voltage to operate one or more components of the data storage device 220 (e.g., a controller, a hard disk, a motor, etc.). Thus, the host system 210 may be voltage source or a power source for the data storage device 220. The connection cable 250 may include one or more voltage lines (e.g., wires, pins, etc.) that may receive the input voltage from the host system 210. The one or more voltage lines may provide the input voltage (received from the host system 210) to the data storage device 220. The host system 210 may provide the input voltage to the data storage device 220 using the storage interface 212 (e.g., via the storage interface 212).

The connection cable 250 includes a power monitoring module 252 that may monitor the input voltage provided to and/or received by the data storage device 220. The power monitoring module 252 may monitor the input voltage to determine whether the input voltage is within a range of voltages. In one embodiment, the power monitoring module 252 may provide an indication (e.g., an audible and/or visual indication) when the input voltage is within the range of voltages. In another embodiment, the power monitoring module 252 may provide an indication when the input voltage is not within the range of voltages. The indication of whether the input voltage is (or is not) within the range of voltages may allow a user to more easily determine whether the data storage device 220 is not operating properly because the input voltage received from the host system 210 is not suitable for the data storage device 220. In one embodiment, the input voltage may be within the range of voltages if the input voltage is less than or equal to a first/higher voltage and is greater than or equal to a second/lower voltage. In another embodiment, the input voltage may be within the range of voltages if the input voltage is less than a first/higher voltage and is greater than a second/lower voltage.

In one embodiment, the power monitoring module 252 may include comparison components (e.g., may include comparators as discussed in more detail below in conjunction with FIG. 3) and an indicator component (e.g., may include a light-emitting diode (LED) as discussed in more detail below in conjunction with FIG. 3). The power monitoring module 252 may also include a reference voltage source that may generate a reference voltage (as discussed in more detail below in conjunction with FIG. 3). The reference voltage source may be used to determine whether the input voltage is (or is not) within the range of voltages.

The data storage device 220 also includes a power management module 240. The power management module 240 may receive the input voltage from the host system 210 (via the connection cable 250) and may use the input voltage to operate and/or provide power to the data storage device 220 and/or to components of the data storage device 220. For example, the power management module 240 may use the input voltage to provide power to and/or to operate a motor in the data storage device 220 or to operate the controller 230. In one embodiment, the power monitoring module 252 may reside in the power management module 240 (not shown in FIG. 2) instead of in the connection cable 250.

Figure 3:
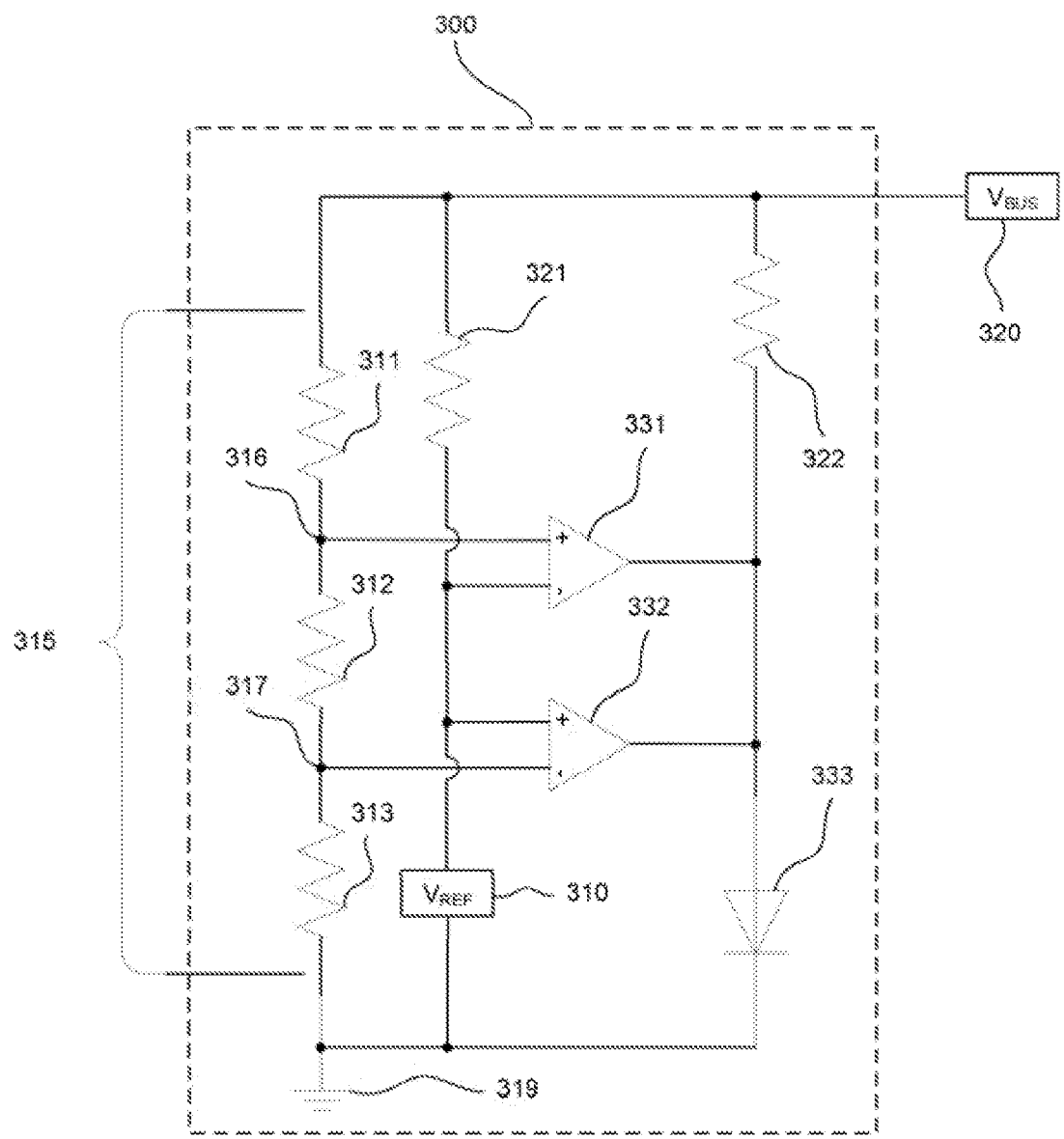
FIG. 3 is a diagram of a power monitoring module, according to an embodiment.

FIG. 3 is a diagram of a power monitoring module 300 according to an embodiment. The power monitoring module 300 includes a comparator 331, a comparator 332, a resistive divider 315, a resistor 321, a resistor 322, a reference voltage source 310, and an LED 333. The comparators 331 and 332 may be examples of comparison components. A comparison component may be any combination of devices, circuits, modules, components, etc., that may be used to compare two or more voltages. The resistance values (e.g., the electrical resistance) of the resistors 321, 322, 311, 312, and 313 may or may not be the same. For example, resistor 322 may be a 330 ohm resistor, resistor 321 may be a 113 ohm resistor, resistor 311 may be a 48.7 kilohm resistor, resistor 312 may be an 11 kilohm resistor, and resistor 313 may be a 49.9 kilohm resistor.

The power monitoring module 300 may receive an input voltage $V_{BUS}$ provided by an input voltage source 320. As discussed above, the input voltage source may be a client device (e.g., a computing device such as a laptop computer, a desktop computer, a cable set-top box, etc.) or a power supply (e.g., an AC adapter, a DC adapter, etc.). The input voltage $V_{BUS}$ may be provided by a communication interface of the client device. For example, the input voltage $V_{BUS}$ may be received from a USB interface of the client device. The power monitoring module 300 may provide the input voltage $V_{BUS}$ to the resistive divider 315. The power monitoring module 300 may also provide the input voltage $V_{BUS}$ to the LED 333 via the resistor 322.

The resistive divider 315 includes resistors 311, 312, and 313 connected in series (with resistor 311 coupled to resistor 312 and resistor 312 coupled to resistor 313). The resistor 313 is coupled to a ground 319 so as to form a resistive divider circuit. The resistance values of the resistors 311, 312, and 313 may or may not be the same. Configured in such an example manner, the input voltage $V_{BUS}$ may be divided down by the resistive divider 315 to produce a first voltage (e.g., a first proportionally smaller voltage) at node 316 and to produce a second voltage (e.g., a second proportionally smaller voltage) at node 317. Thus, the resistive divider 315 may generate a first voltage and a second voltage based on the input voltage $V_{BUS}$. The first voltage (from node 316) may be provided to the first comparator 331 and the second voltage (from node 317) may be provided to the second comparator 332.

The reference voltage source 310 may be one or more of a circuit, a component, a module, a device, etc., that may generate a reference voltage $V_{REF}$. The reference voltage source 310 may provide the reference voltage $V_{REF}$ to the comparators 331 and 332. The comparator 331 may compare the reference voltage $V_{REF}$ with the first voltage received from the node 316. The comparator 331 may produce a signal having a logic low state (e.g., a "0") when the first voltage is greater than the reference voltage $V_{REF}$. The comparator 331 may also produce a signal having a logic high state (e.g., a "1") when the first voltage is less than the reference voltage $V_{REF}$. The comparator 332 may compare the reference voltage $V_{REF}$ with the second voltage received from the node 317. The comparator 332 may produce a signal having a logic low state (e.g., a "0") when the reference voltage $V_{REF}$ is greater than the second voltage. The comparator 332 may also produce a signal having a logic high state (e.g., a "1") when the reference voltage $V_{REF}$ is less than the second voltage.

In one embodiment, if one or more of the comparators 331 and 332 produce a signal having a logic low state (e.g., a "0"), the LED 333 may be shorted to ground. Shorting the LED 333 to ground may cause the LED 333 to stop emitting light. The comparators 331, 332, and the LED 333 may allow the power monitoring module 300 to provide an indication of whether the input voltage $V_{BUS}$ is within a range of voltages. The power monitoring module 300 may be able to indicate (using the LED 333) whether the input voltage $V_{BUS}$ is within a range of voltages by generating the first voltage and the second voltage and comparing the first voltage and the second voltage with the reference voltage $V_{REF}$. When the input voltage $V_{BUS}$ fluctuates, changes, and/or varies (e.g., the voltage goes up or down) the LED 333 may flicker and/or blink when the input voltage fluctuates changes, and/or varies to a voltage that is not within the range of voltages (e.g., to a voltage that is outside the range of voltages). In one embodiment, the power monitoring module 300 may indicate that the input voltage $V_{BUS}$ is within the range of voltages when the LED 333 remains lit or solid and may indicate that the input voltage $V_{BUS}$ is not within the range of voltages when the LED 333 flickers or blinks.

In one embodiment, the LED 333 may be configured to remain lit or solid when the input voltage $V_{BUS}$ is not within the range of voltages. For example, the power monitoring module 300 may include additional logic, circuits, and/or components (e.g., OR gates, AND gates, etc.) coupled to the comparators 331, 332 and the LED 333. The additional logic, circuits, and/or components may cause the LED 333 to remain lit or solid when the input voltage $V_{BUS}$ is not within the range of voltages. In a further embodiment, other circuits, devices, components, and/or modules may be used to provide an indication of whether the input voltage $V_{BUS}$ is within the range of voltages. For example, the power monitoring module 300 may include a speaker/alarm that may be coupled to the comparators 332 and 332. The speaker/alarm may produce an audible noise when the input voltage $V_{BUS}$ is not within the range of voltages.

Figure 4:
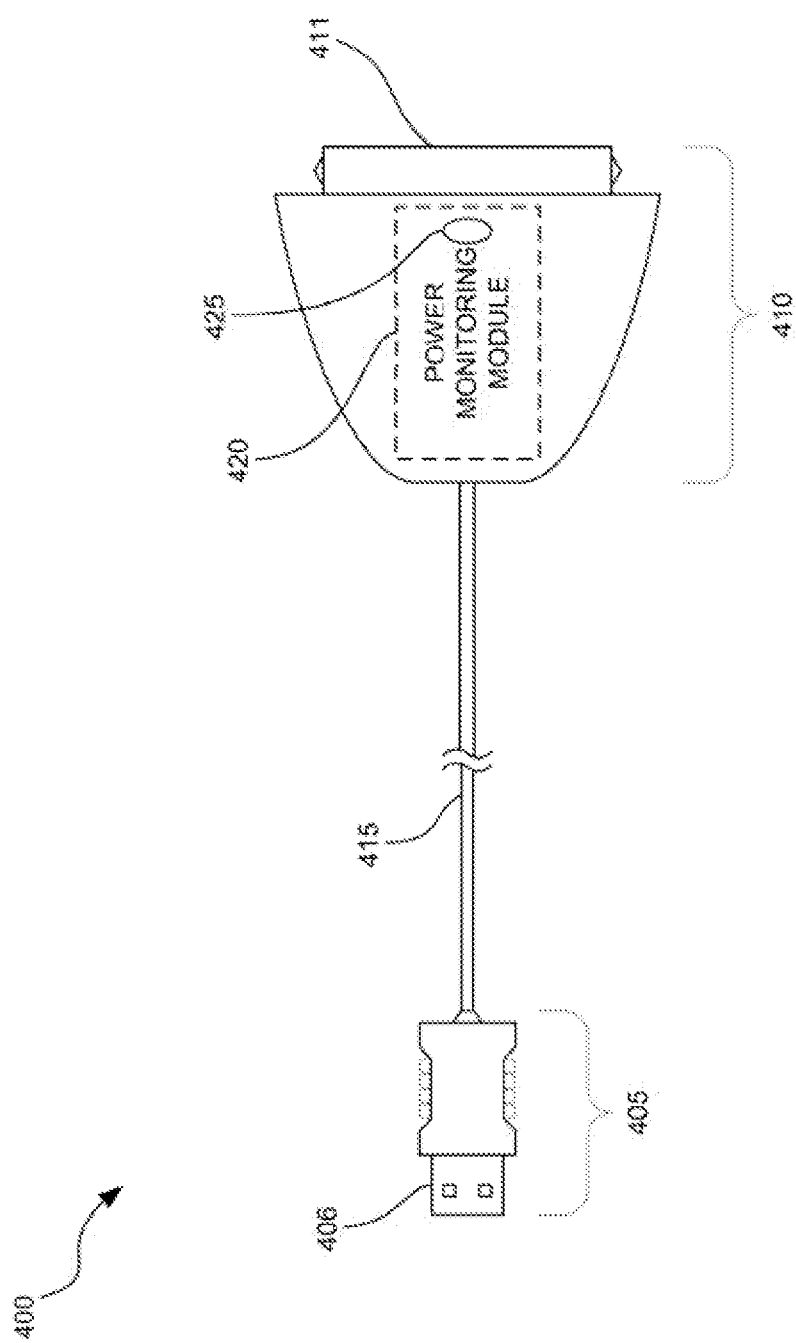
FIG. 4 is a diagram of a connection cable, according to an embodiment.

FIG. 4 is a diagram of a connection cable 400 according to an embodiment. The connection cable 400 may be configured to be physically connected to a data storage device (e.g., a NAS device or a DAS device). For example, the connection cable 400 of FIG. 4 may represent an embodiment of a connection cable 250 of the data storage system 200 of FIG. 2. Although a particular embodiment of a connection cable 400 is depicted in FIG. 4, it should be understood that connection cables as described herein may include one or more features of the connection cable 400 described below, while being embodied in a form other than that illustrated in FIG. 4. For example, the power monitoring features described herein may be integrated in a data storage device, or a connection cable may comprise a different size, shape and/or form than that illustrated in FIG. 4.

The connection cable 400 may be configured to be connected to a data storage device, a host system, and/or a power supply. The host system may be, for example, a client device or a computing device which is configured to access data stored in a connected data storage device using the connection cable 400. In an embodiment, the host system may be a personal computer, a laptop, a tablet, a mobile phone, a wearable computing device, a cable set-top box, a video game console, and/or any other device which may be configured to access the data stored in the data storage device.

In an embodiment, the connection cable 400 includes a first cable connector 405, a second cable connector 410, and cable portion 415. The first cable connector 405 includes a first communication interface 406. The second cable connector 410 includes a second communication interface 411 and a power monitoring module 420. The cable portion 415 may be configured, for example, to connect the communication interface 406 to the communication interface 411. In the embodiment illustrated in FIG. 4, the second cable connector 410 has an approximately trapezoidal shape. However, it is understood that the second cable connector 410 may comprise any desirable shape and/or size.

The communication interfaces 406 and 411 can comprise, for example, serial bus interfaces such as USB and/or SATA interfaces. In one embodiment, the communication interface 406 and 411 may comprise SATA plugs. In another embodiment, the communication interface 406 may comprise a USB standard-A plug, while the communication interface 411 may comprise a USB micro-B plug. In a further embodiment, the communication interface 406 and the communication interface 411 can comprise other types of plugs for different types of communication interfaces. For example, the communication interface 406 may include a FireWire plug. In another example, the communication interface 406 and the communication interface 411 can comprise a USB standard-B plug, a USB mini-A plug, a USB mini-B plug, a USB mini-AB plug, a USB micro-A plug, USB micro-AB plug, or other interface. In an embodiment, the communication interface 406 and the communication interface 411 can utilize a communications protocol or interfaces aside from USB and SATA such as other serial bus protocols or interfaces.

In an embodiment, the communication interface 406 is configured to be connected to a host system or power supply and the communication interface 411 is configured to be connected to a data storage device. In another embodiment, the communication interface 411 is configured to be connected to a host system or power supply and the communication interface 406 is configured to be connected to a data storage device. The communication interface 406 may be configured to receive data from a serial bus. For example, when the communication interface 406 is connected to a host system, the communication interface 406 may read data from and/or write data to the data storage device via one or more data lines (e.g., one or more wires, pins, etc.). The communication interface 406 may also be configured to receive a voltage from the host system or power supply via one or more voltage lines (e.g., one or more wires, pins, or a power bus line). For example, when the communication interface 406 is connected to a host system, it may receive an input voltage from a power bus line and may provide the input voltage to a data storage device via communication interface 411.

In an embodiment, when the communication interface 406 is connected to a host system and the communication interface 411 is connected to a data storage device, the communication interface 406 may enable direct access to the data storage device. Thus, the host system may directly access the data storage device. In an embodiment, the communication interface 406 may provide data transfer speeds of approximately 3.2 Gbits/s, or greater. In an embodiment, the communication interface 406 may provide data transfer speeds of approximately 10 Gbits/s. In an embodiment, the communication interface 406 may provide data transfer speeds according to a USB 2.X protocol. In an embodiment, the communication interface 406 may provide data transfer speeds according to a USB 3.X protocol. In an embodiment, the communication interface 406 may provide data transfer speeds according to a Thunderbolt protocol, or other data transfer speeds may be possible.

In an embodiment, the connection cable 400 may include a bridge unit (not shown in FIG. 4). For example, the connection cable 400 may include a USB bridge, a Thunderbolt bridge, or other type of bridge. In an embodiment, the bridge unit can translate between two different protocols. For example, if a connected storage device communicates in a first protocol, but not a second protocol, the bridge unit may translate the second protocol to the first protocol, or vice versa.

As discussed above, the power monitoring module 420 that may monitor the input voltage received from a host system via the communication interface 406. The power monitoring module 420 may monitor the input voltage to determine whether the input voltage is within a range of voltages. In one embodiment, the power monitoring module 420 may use the LED 425 to indicate that the input voltage is within the range of voltages. In another embodiment, the power monitoring module 420 may use the LED 425 to indicate that the input voltage is not within the range of voltages. The power monitoring module 420 may also include comparison components (e.g., comparators) and a reference voltage source (as discussed above in conjunction with FIG. 3).

In an embodiment, the power monitoring module 420 may include one or more controllers to perform various operations disclosed above. Furthermore, in an embodiment, the power monitoring module 420 may include a non-transitory machine readable medium configured to store software which when executed by one or more controllers of the power monitoring module 420, may cause the one or more controllers to perform one or more operations disclosed above.

Figure 5:
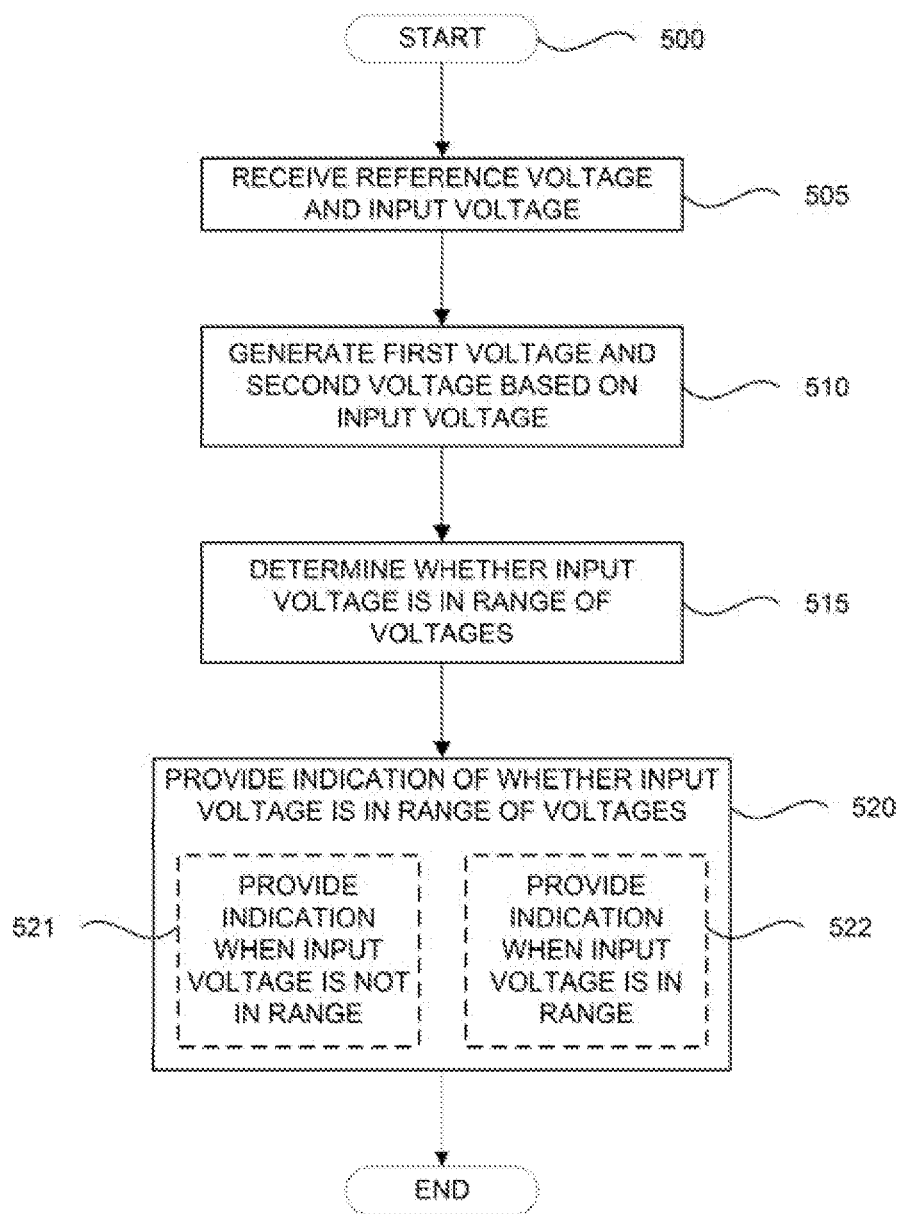
FIG. 5 is a flow diagram illustrating a process for monitoring a voltage provided to a data storage device, according to an embodiment.

FIG. 5 is a flow diagram illustrating a process 500 for monitoring a voltage provided to a data storage device, according to an embodiment. The process 500 may be performed by a power monitoring module, as illustrated and discussed above in conjunction with FIGS. 2, 3, and 4. The power monitoring module may reside in a connection cable (e.g., connection cable 250 illustrated in FIG. 2 and connection cable 400 illustrated in FIG. 4) or may reside in the data storage device.

At block 505, the process 500 includes receiving a reference voltage and an input voltage. For example, the input voltage may be received by a host system or client device (e.g., a computing device such as a laptop computer, a cable set-top box, etc.) and the reference voltage may be generated by a reference voltage source (as discussed above). The process 500 includes generating a first voltage and a second voltage based on the input voltage at block 510. For example, the first voltage and the second voltage may be generated by providing the input voltage to a resistive divider (as discussed above).

At block 515, the process 500 includes determining whether the input voltage is within a range of voltages. For example, the first voltage and the second voltage may be compared with the reference voltage using a first comparison component and a second comparison component to determine whether the input voltage is within the range of voltages (as discussed above). The process 500 includes providing an indication of whether the input voltage is within the range of voltages at block 520. In one embodiment, the process 500 includes providing an indication when the input voltage is not in the range of voltages at block 521. For example, an LED may be solid or lit when the input voltage is not in the range of voltages. In another embodiment, the process 500 includes providing an indication when the input voltage is in the range of voltages at block 522. For example, an LED may be solid or lit when the input voltage is in the range of voltages.

Additional Embodiments

Those skilled in the art will appreciate that in some embodiments, other types of distributed data storage systems can be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc., as used herein are meant as labels to distinguish among different elements and may not necessarily have an ordinal meaning according to their numerical designation.

What is claimed is:

1. A storage device connection cable, the storage device connection cable comprising:
    a first cable connector configured to couple the storage device connection cable to a data storage device;
    one or more voltage lines configured to receive an input voltage from a voltage source, wherein the input voltage is used to power the data storage device;
    one or more data lines configured to communicate data with a computing device;
    a voltage comparison component configured to determine whether the input voltage is within a range of voltages suitable to power the data storage device; and
    an indicator component configured to provide an indication of whether the input voltage is within the range of voltages, wherein the indicator component is located in the first cable connector.

2. The storage device connection cable of claim 1, wherein the voltage comparison component comprises:
    a first comparator configured to determine whether a reference voltage is greater than a first voltage; and
    a second comparator configured to determine whether the reference voltage is less than a second voltage.

3. The storage device connection cable of claim 2, further comprising:
    a resistive divider configured to generate the first voltage and the second voltage based on the input voltage.

4. The storage device connection cable of claim 1, wherein the storage device connection cable comprises a serial advanced technology attachment (SATA) cable.

5. The storage device connection cable of claim 1, wherein the indicator component comprises a light-emitting diode (LED).

6. The storage device connection cable of claim 2, further comprising:
    a reference voltage source configured to generate the reference voltage.

7. The storage device connection cable of claim 1, wherein the computing device comprises the voltage source.

8. The storage device connection cable of claim 1, further comprising:
    a second cable connector configured to couple the storage device connection cable to the computing device.

9. The storage device connection cable of claim 1, wherein the indicator component is configured to provide the indication responsive to the input voltage being within the range of voltages.

10. The storage device connection cable of claim 1, wherein the indicator component is configured to provide the indication responsive to the input voltage being not within the range of voltages.

11. A data storage device capable of receiving an input voltage via a connection cable, the data storage device comprising:
    a voltage comparison component configured to determine whether the input voltage received by the data storage device is within a range of voltages suitable to power the data storage device, wherein the input voltage is used to power the data storage device; and
    an indicator component configured to provide an indication of whether the input voltage is within the range of voltages.

12. The data storage device of claim 11, wherein the voltage comparison component comprises:
    a first comparator configured to determine whether a reference voltage is greater than a first voltage; and
    a second comparator configured to determine whether the reference voltage is less than a second voltage.

13. The data storage device of claim 12, further comprising:
    a resistive divider configured to generate the first voltage and the second voltage based on the input voltage.

14. The data storage device of claim 11, wherein the indicator component comprises a light-emitting diode (LED).

15. The data storage device of claim 12, further comprising:
    a reference voltage source configured to generate the reference voltage.

16. The data storage device of claim 11, further comprising:
    one or more voltage lines configured to receive the input voltage from a voltage source; and
    one or more data lines configured to communicate data with a computing device.

17. The data storage device of claim 11, wherein the indicator component is configured to provide the indication responsive to the input voltage being within the range of voltages.

18. The data storage device of claim 11, wherein the indicator component is configured to provide the indication responsive to the input voltage being not within the range of voltages.

19. A method of monitoring an input voltage received via a connection cable, comprising:
- receiving a reference voltage and an input voltage, wherein the input voltage powers a data storage device;
- generating a first voltage and a second voltage based on the input voltage;
- determining whether the input voltage is within a range of voltages suitable to power the data storage device, based on the first voltage, the second voltage, and the reference voltage; and
- providing, on a first cable connector of the connection cable, an indication of whether the input voltage is within the range of voltages.

\* \* \* \* \*